United States Patent
Kaveh

[19]

[11] Patent Number: 6,027,662
[45] Date of Patent: Feb. 22, 2000

[54] MATERIALS PROCESSING BY SEPARATELY GENERATED PROCESS MEDIUM CONSTITUENTS

[75] Inventor: Farrokh Kaveh, Mountain View, Calif.

[73] Assignee: Lam Research Corporation, Fremont, Calif.

[21] Appl. No.: 08/624,129

[22] Filed: Mar. 29, 1996

[51] Int. Cl.$^7$ ........................................................ B44C 1/22
[52] U.S. Cl. ................ 216/59; 156/345; 216/67
[58] Field of Search .................. 156/345, 643.1, 156/653.1, 657.1; 204/298.31; 118/723 R; 216/67, 59, 84; 252/79.1

[56] References Cited

U.S. PATENT DOCUMENTS

5,405,492  4/1995  Moslehi ............................ 156/345 P
5,498,312  3/1996  Laermer ............................ 156/345 P

*Primary Examiner*—William Powell
*Attorney, Agent, or Firm*—Cesari and McKenna, LLP

[57] ABSTRACT

The invention provides method and apparatus for materials processing that enable the concentration and identity of a constituent of an excited gaseous materials processing medium to be selected relatively independently of the concentration and identity of other constituents of the same medium. Individual constituents are generated at distinct, separate locations, such as separate chambers, under different process conditions; one or more of the temperature, pressure, power exposure, gas composition and local reactor geometry, selected to optimize generation of a specific constituent, are different at the two locations. Then the individual constituents are combined and brought into contact with the substrate to be treated. In another aspect, the invention allows for the generation of the entire excited portion of a processing medium at a single location distinct from the site of substrate treatment in order to weaken the coupling between the generation of the medium and its application.

73 Claims, 3 Drawing Sheets

MATERIALS PROCESSING BY SEPARATELY GENERATED PROCESS MEDIUM CONSTITUENTS

FIELD OF THE INVENTION

This invention relates to materials processing techniques using an excited gaseous medium. Particularly, this invention relates to methods and apparatus for enhancing plasmadriven etching and deposition processes.

BACKGROUND OF THE INVENTION

In one approach to materials processing, a substrate is exposed to excited constituents such as ions or neutral radicals that interact physically or chemically with the substrate so as to effect deposition of material onto or removal of material from the substrate. The excited constituents are part of an excited gaseous processing medium generated by applying electromagnetic excitation to a reactant gas composition. Generally, a given processing operation is optimized by a specific processing medium chemistry, defined by the identities and concentrations of the active constituents. To some extent, the chemistry of the processing medium may be fixed by judicious choice of process parameters such as temperature, pressure, gas composition, gas flow rates, reactor geometry, and applied power. However, the complex dependence of the processing medium's composition on the process parameters limits the extent to which any single compositional variable may be adjusted independently of another one. Often, changes made in one processing parameter in order to adjust the concentration of one constituent adversely alter the identity or concentration of another critical constituent, or change other aspects of the process in an undesirable way. Consequently, the typical processing sequence uses a combination of process parameters which are selected to compromise among, or to optimize a single one of, the various competing process performance characteristics.

Plasma etching techniques, such as are widely used in the semiconductor industry, illustrate how the interaction of the process parameters contains the processing medium chemistry. In many common etching processes, the processing medium contains both ionic and neutral radical elements. Material is removed from the substrate by relatively volatile species created by reaction of radicals with the substrate material; ions impinging the surface may provide the energy needed to eject substrate material from the substrate so it can react with a radical or may volatilize products residing on the substrate.

The plasma is generally generated by applying, an oscillating electromagnetic field to a reactant gas composition in order to excite collisions between the molecules that result in ionization or other excitation. Many specific approaches to applying this excitation have been developed. Parallel plate reactors, as shown in U.S. Pat. Nos. 4,626,312 and 5,248,371, are the most elementary plasma etching systems. The plasma is generated in situ between the plates by a radio frequency ("rf") electrical field oriented perpendicularly to the substrate.

Other reactor designs have been devised to broaden the range of possible process parameters values so as to improve etch characteristics such as rate, anisotropy, or selectivity. Etching systems have commonly incorporated additional electrical or magnetic power sources. For example, Skidmore, *Semiconductor International*, 1989, pp. 74–79 and U.S. Pat. No. 4,668,338 describe systems incorporating additional magnetic fields for enhancing the plasma density.

Some designs have also removed the creation of the reactive constituents from the vicinity of the substrate. In the planar plasma technique described in U.S. Pat. No. 4,948,458, the plasma is generated in the region of the chamber opposite the substrate by a rf current resonated through a planar coil disposed outside of the reactor chamber. In so-called "downstream" processes, the plasma is created upstream of a main etching chamber with the reactive constituents being subsequently transported to the main chamber where the etching takes place. For example, the system described in U.S. Pat. No. 4,368,092, herein incorporated by reference, generates the plasma in a tubular chamber, with an external helical inductive resonator, in fluid communication with a chamber in which the etching occurs. Electron cyclotron resonance ("ECR") techniques, described by Skidmore, generate the plasma in a microwave resonance chamber in communication with an etching chamber.

Plasma etching finds wide application, for example, in fabricating VLSI structures for integrated circuits. The trend towards greater device densities and smaller minimum feature sizes in integrated circuits has imposed increasingly stringent requirements on the basic IC fabrication steps including etching as well as deposition, film formation, and doping. The shrinking scale of VLSI structures has made precise feature delineation more difficult due to the greater criticality of etch anisotropy. Proper rendition of smaller features requires a higher degree of directionality in the transport processes comprising the etch. Collisions between reactant ions or radicals occur less frequently in a rarer medium than in a denser one, thereby allowing for reactant movement along longer straight paths as the plasma pressure is decreased. Lower process pressures also facilitate the elimination of volatile products from the substrate, especially from the interiors of high aspect-ratio features.

This demand for lower processing pressures is problematic for plasma-driven processes because of the critical role the reactant concentration, strongly influenced by the process pressure, plays in determining the etch rate. As the pressure is decreased to sufficiently low levels to satisfy the structure's dimensional requirements, the overall etch process efficiency becomes too low to fabricate devices quickly enough to be practical. The etch rate can be enhanced somewhat by increasing the plasma density, for example by providing more power to the reactor. However, increasing the power level generally requires concomitant adjustment of other process parameters. Furthermore, the efficacy of this approach is limited because at lower pressure, not only is the overall reactant density changed, but also the relative ratios of different types of active constituents; at lower pressures, neutral radical generation is suppressed relative to ionization. Thus, the compositional profile of the processing medium cannot be duplicated at lower pressures simply by increasing the plasma density. And ions in the processing medium, even if present in superabundance, cannot perform the function of a given neutral constituent. Without the contribution of the neutral species, the etch rate is limited.

In these etch chemistries, the opposing effects of an experimental parameter such as pressure on the concentration of different processing medium constituents limits the etch rate attainable at low pressures. Or, conversely, it limits the transport directionality, and thus feature size, achievable at a given etch rate.

DESCRIPTION OF THE INVENTION

Brief Summary of the Invention

The invention allows greater flexibility in the formulation of processing media by enabling the concentration and identity of a processing medium constituent to be selected relatively independently of the concentration and identity of other constituents in the same medium. Individual constituents are generated at distinct, separate locations, such as separate chambers, under different process conditions; one or more of the temperature, pressure, power exposure, gas composition and local reactor geometry, selected to optimize generation of a specific constituent, are different at the two locations. Then the individual constituents are combined and brought into contact with the substrate to be treated. Throughout this description, the term "constituent" denotes an identifiable component of the medium that is generated in a distinct location according to the invention. A constituent may include a single ion or radical or a constituent may itself be a complex mixture of several ionic and neutral species.

In addition to broadening the range of possible processing medium chemistries, the relative mutual independence of the medium's elements simplifies process adjustments in the course of a given processing operation. Because the coupling between the parameters controlling the respective constituents is weakened, the concentration of one constituent can be altered by simple, intuitive adjustments in the process parameters governing the location at which that constituent is generated without causing major changes in another constituent. This weakened coupling enables incidental fine adjustment of, for example, etch selectivity or other process characteristics.

In general, any number of auxiliary chambers may be incorporated into a system made in accordance with the invention for generating respective constituents of the processing medium. The invention encompasses systems that generate one or more of the constituents in the same chamber as the ultimate materials processing operation as well as systems that generate all constituents at locations distinct from the ultimate materials processing site. The invention is not limited to any particular processes for generating the constituents or to any particular chemistry of the excited processing medium.

In one embodiment, particularly advantageous for etching operations, ionized species are generated primarily in a process chamber housing the substrate, and neutral species generation occurs in a separate auxiliary chamber. Specifically, the ability to generate the primarily neutral and primarily ionized constituents of the plasma separately enables the operation of the process chamber at lower pressures, which are compatible with good ion density and directionality, without limiting the concentration of neutral species in the plasma. In a preferred embodiment, a primarily ionized constituent is generated above the substrate at low pressure, for example in the etching chamber of a conventional plasma system. The primarily neutral radical constituent is generated in a separate second chamber, such as a tube wrapped with a inductive resonator, at a higher pressure. The primarily neutral constituent is then admitted into the process chamber to complete the etching medium. The use of two distinct chambers allows the use of higher pressure in the radical generation and thereby a higher radical concentration. This embodiment of the invention produces enhanced etch rates at lower pressures with good anisotropy, thereby affording better product quality at lower costs.

In another aspect, the invention allows for the generation of the entire excited portion of a processing medium at a single location distinct from the site of substrate treatment in order to weaken the coupling between the generation of the medium and its application. In one such embodiment, a primarily neutral reactive processing medium for chemical vapor deposition ("CVD") is generated in a second separate chamber at a higher pressure than the optimal deposition pressure, which is maintained over the substrate in a deposition chamber. The processing medium is then admitted to the deposition chamber.

Thus, in one or more of its embodiments the invention provides additional degrees of freedom in the selection of compositions of excited gaseous processing media so as to permit optimization of various, possible conflicting etch requirements such as reaction rate, anisotropy, and selectivity; provides a method and apparatus for materials processing by an excited gaseous processing medium that facilitates changing the composition of the medium during processing; and provides a method and apparatus for enhancing etch rates in materials processing systems incorporating excited gaseous processing media.

BRIEF DESCRIPTION OF THE DRAWINGS

The foregoing discussion will be understood more readily from the following detailed description of the invention, when taken in conjunction with the accompanying drawings, in which like reference numerals indicate identical or functionally similar elements.

It will be appreciated that, for purposes of illustration, these figures are not necessarily drawn to scale.

DETAILED DESCRIPTION OF THE INVENTION

Figure 1:
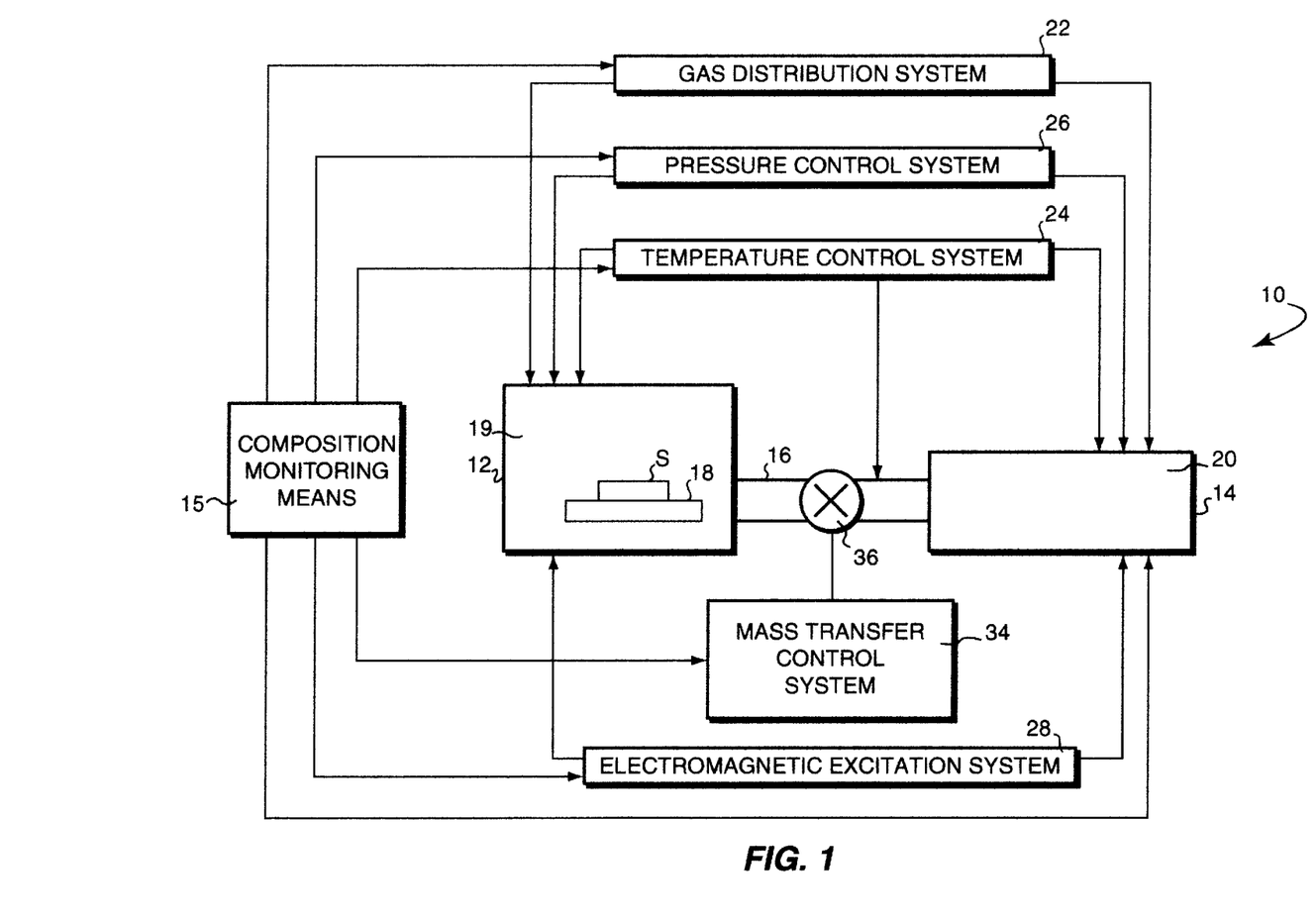
FIG. 1 schematically illustrates a multi-chambered material processing system made in accordance with a preferred embodiment of the present invention.

With reference first to FIG. 1, a materials processing system according to the invention, generally designated at 10, includes a process chamber 12 with an auxiliary chamber 14. Chambers 12 and 14 are generally gastight. A conduit 16 is joined to the process chamber 12 and the auxiliary chamber 14 so as to connect the respective interiors 19 and 20 of those chambers. A holder 18 for a substrate S is positioned inside the process chamber 12.

A gas distribution system 22 is coupled to the process chamber 12 and the auxiliary chamber 14 so as to allow independent introduction of gaseous species into each of the respective chambers 12 and 14. A temperature control system 24, coupled to the process chamber 12 and the auxiliary chamber 14, and optionally also to the conduit 16, provides independent control of the temperatures within the respective chambers 12 and 14. A pressure control system 26, coupled to the process chamber 12 and the auxiliary chamber 14, provides independent control of the pressure within each of the respective chambers 12 and 14. An electromagnetic excitation system 28 is coupled to the process chamber 12 and the auxiliary chamber 14 so as to provide excitation to gaseous species contained in the respective chambers 12 and 14. A mass transfer control system 34 regulates fluid communication between the interiors of the chambers 12 and 14. Conventional means, 15 may be provided for sampling the composition of the processing medium or a constituent in the process chamber 12 or the auxiliary chamber 14. Any of the control systems 22, 24, 26, 28, and 34 may be coupled to the monitoring means 15 for adjustment of the processing parameters in each of the chambers 12 and 14, or adjustment of the rate of mass transfer between the two chambers 12 and 14 during a processing operation, based on predetermined criteria.

Figure 4:
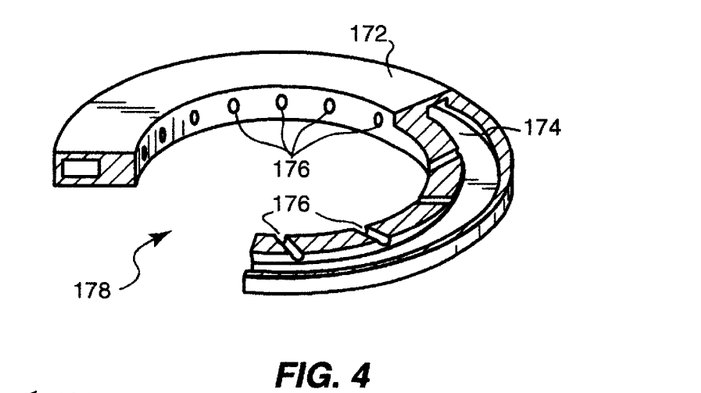
FIG. 4 is a partially cut-away, perspective view of a gas diffusion ring for the process chamber of FIG. 2.

The gas distribution system 22 of a preferred embodiment includes a gas diffuser, one example of which is shown in FIG. 4, positioned within each of the chambers, which provides an optimum flow pattern of the injected gas within each of the chambers. For etching applications, the injected gas composition generally includes oxygen and/or a halogenous species. Depending on the substrate material and the available operating conditions, the injected gas composition for etching generally includes any one or several of oxygen, chlorine, boron trichloride, carbon or silicon tetrachloride, trifluoromethane, tetrafluoromethane, nitrogen trifluoride, sulfur hexafluoride, or hexafluoroethane. For deposition of silicon-containing compounds, for example silicon nitride or silicon dioxide, the injected gas composition typically includes silane with a nitrogen-bearing species such as nitrogen, ammonia, or nitrous oxide. The injected gas composition generally also includes a carrier gas such as hydrogen. However, any gas mixture providing reactants from which the constituents of the processing medium may be generated is appropriate for incorporation into a system of the invention.

The temperature control system 24 of the preferred embodiment may include several features that aid in temperature regulation of the chambers 12 and 14, or of the conduit 16, at preselected setpoint values. For example, passageways, not shown, may allow the circulation of a heat transfer medium, such as water, through the chambers. Bores, not shown, may be provided through the chamber 12 to receive resistive heating elements. The substrate holder 18 may be configured to allow for the circulation thereinthrough of a heat transport medium, such as helium and/or water. Setpoint temperatures are generally chosen from a range bounded by 0° C. and 500° C.

The pressure control system 26 includes a pressure sensor, not shown, positioned inside each of the chambers 12 and 14 that provides feedback to some pressure regulating means in order to establish and maintain the pressure inside each of the respective chambers 12 and 14 in accordance with respective preselected setpoint values. Typically, the pressure regulating means controllably throttles a valve through which the interior of each of the chambers 12 and 14 communicates with a vacuum system. The setpoints are generally chosen from a pressure range bounded by $10^{-5}$ Torr and 5 Torr, although pressures outside this range may be preferred for some applications.

The electromagnetic excitation system 28 may incorporate any means for generating excited species. The configuration and power level of the excitation applied to each chamber is chosen according to the requirements of the constituent being generated in the respective chamber. The mass transfer control system 34 includes a valve 36 regulating flow through the conduit 16. For operation of the process chamber 12 at a higher pressure than the auxiliary chamber 14, the mass transfer control system may additionally incorporate pumping means.

The appropriate length for the conduit 16 depends on the details of the processing operation. Longer conduits 16 promote flexibility in placement of the chambers and may aid mutual thermal insulation of the chambers 12 and 14. On the other hand, it may be desirable to eliminate conduit altogether so that matter may be conveyed from the auxiliary chamber 14 directly into the process chamber 12. A shorter mass transfer distance offers less opportunity for recombination events or collisions that may degrade the concentration of reactive species generated in the auxiliary chamber 14. Coating the surfaces of the mass transfer path with a lowsticking-coefficient material such as Teflon® can also minimize the occurrence of recombination. Control of the temperature in the conduit 16 can mitigate the loss of a temperature-sensitive constituent during transfer into the process chamber 12.

In operation, power provided by the electromagnetic excitation system to the respective gaseous species in the chambers 12 and 14 generates distinct constituents of a materials processing medium in the respective chambers. The system is operated to apply to each individual chamber an ensemble of values of processing parameters such as temperature, pressure, gas composition, and power level that optimizes the generation of a particular element to be incorporated into the processing medium. In general, values for one or more of the processing parameters just listed are different for the respective chambers 12 and 14. The parameters applied to the process chamber generally must be chosen with consideration of the medium's interaction with the substrate as well as the medium's composition. For purposes of clarity, in the remainder of this description, the constituent generated in the auxiliary chamber 14 is designated the first constituent; the constituent generated in the process chamber 12 is designated the second constituent.

After independent generation of the first and second constituents, the mass transfer control 34 system admits the first constituent from the auxiliary chamber 14 to the process chamber 12 in a controlled manner for mixing with the second constituent to form the processing medium in the process chamber 12. The constituents of the processing medium interact with the substrates so as to modify its surface.

The separate generation of individual processing medium constituents afforded by the invention is particularly advantageous for plasma etching of small-scale features in integrated circuit manufacture. A primarily neutral constituent generated in an auxiliary chamber operating at a pressure consistent with adequate levels of the desired neutral species in the processing medium, typically on the order of about 1%. The auxiliary chamber pressure chosen for a particular operation depends on the gas composition and the desirable power level. The process chamber operates at a lower pressure consistent with good plasma density and etch anisotropy. Typically, the process chamber pressure is on the order of 1 m Torr or lower, such as pressures lower than 10 milliTorr, especially less than approximately 5 milliTorr, although skilled practioners of the art may choose other process chamber pressures to achieve a desired result.

Figure 2:
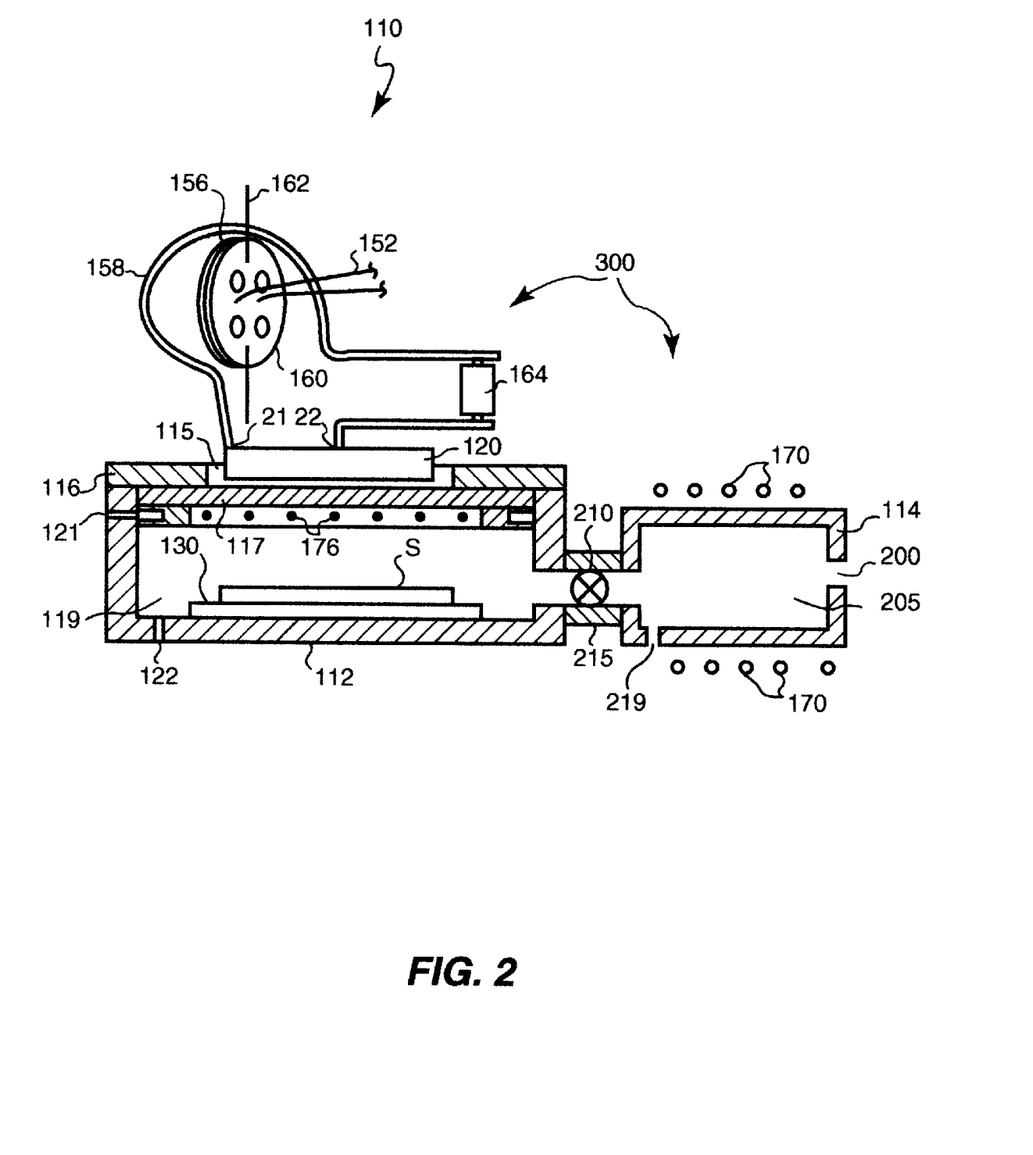
FIG. 2 is a cross-sectional view of a multi-chambered etching system.

With reference to FIG. 2, such a system 110 for forming an etching medium includes a process chamber 112 of metal, featuring an access port 115 formed in an upper wall 116. A dielectric shield 117, of quartz or some other ceramic, disposed below the upper wall 116 extends across the access port 115. The dielectric shield 117 is sealed to the upper wall 116 so as to define a gastight interior 119 of the process chamber 112. A surface 130 supports a substrate S in the process chamber 12. An inlet port 121 is formed through the wall of the chamber 112 for introduction of a first gas composition into the interior 119 of the chamber 112 by a gas distribution system of the type depicted in FIG. 1. An outlet port 122 is also formed through the wall of the chamber for communication with a pressure control system of the type depicted in FIG. 1. The locations of the inlet port 121 and outlet port 122 are chosen to optimize process performance. In general, the gas distribution and pressure control systems are configured to respectively introduce and remove gas so as to allow even gas distribution throughout the interior 119.

The system 110 additionally comprises an auxiliary chamber 114 formed by a tubular body having an inlet port 200 for introduction of a second gas composition into the interior 205 of the chamber 114 by the gas distribution system 126. A valve 210 moderates the transfer of matter through a conduit 215 between the auxiliary and process chambers 114 and 112 as directed by the mass transfer control system (not shown). The pressure control system communicates with the interior 205 through an outlet port 219 in the chamber wall.

An electromagnetic excitation apparatus, designated generally as 300, of the system 110 incorporates two rf generators of a type which is generally used in the operation of semiconductor processing equipment. Such rf generators usually operate at a frequency from about 13.56 MHz to 100 MHz, a low impedance, typically about 50 ohms, and are capable of producing from about 1 to 6 amps, usually from about 2 to 3.5 amps, with an RMS voltage of at least about 50 volts, usually greater than 70 volts.

The electromagnetic excitation apparatus also comprises a planar circular coil 120, driven by a first rf generator, disposed within the access port 115 adjacent the dielectric shield 117 for providing excitation to the first gas composition in the process chamber 112. The coil 120 is formed as a spiral of copper wire having a current carrying capacity of about 5 to 30 amps and has a center tap 122 and an outer tap 121. The coil 120 includes a sufficient number of turns to produce a relatively uniform magnetic field across its entire diameter. The number of turns depends on the diameter of the coil 120, generally being 5 to 8 turns for a diameter of 13 to 18 cm. The plane of the coil 120 is oriented parallel to both the dielectric shield 117 and the support surface 130 upon which the substrate S is disposed. The distance between the coil 120 and the support surface 130 depends on the particular application but is usually in the range from about 3 to 15 cm, particularly from about 5 to 10 cm.

Figure 3:
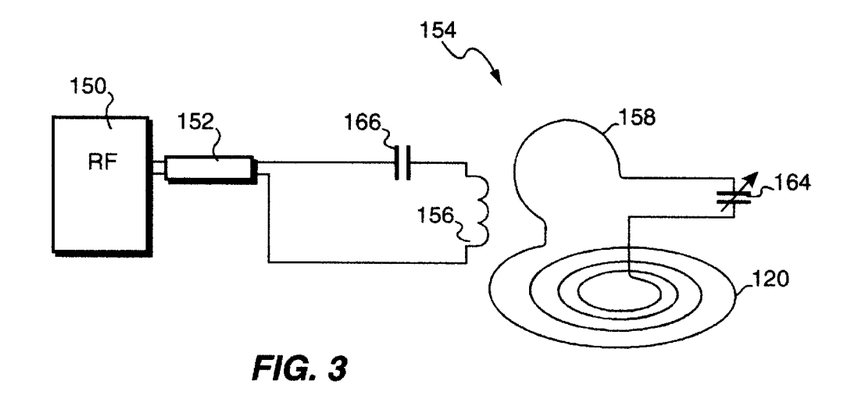
FIG. 3 is a schematic view of the circuitry driving the planar coil of FIG. 2.

With reference to FIGS. 2 and 3, the output of a first rf generator 150 is fed by a coaxial cable 152 to a matching circuit 154. The matching circuit 154 includes a primary coil 156 and a secondary loop 158 which may be mutually positioned to adjust the effective coupling of the circuit and allow for loading of the circuit at the frequency of operation. For convenience the primary coil 156 is mounted on a disk 160 rotatable about a vertical axis 162 in order to adjust the coupling. A variable capacitor 164 is also provided in series with the secondary loop 158 in order to adjust the circuit resonant frequency with the frequency output of the rf generator 150. Impedance matching maximizes the efficiency of power transfer to the planar coil 120. An additional capacitor 166 is provided in the primary circuit in order to cancel part of the inductive reactance of the coil 156 in the circuit. It will be appreciated that the system 110 of the invention might also incorporate other circuit configurations for resonantly tuning the operation of the planar coil 120 and for matching the impedance of the coil circuit with the first rf generator 150.

With reference to FIG. 2, the electromagnetic excitation apparatus 300 of the system 110 additionally incorporates a helical inductive resonator. The resonator couples a second rf generator (not shown) to the interior 205 of the chamber 114 for exciting the second gas composition to generate neutral radicals. The coupler includes a helical coil 170 wound concentrically around the tube defining the auxiliary chamber 114. Rf power is applied to the coil 170 from the second rf generator, through any one of the impedance matching means (not shown) known in the art, one type of which has been discussed above.

With reference to FIGS. 2 and 4, in a preferred embodiment, the gas distribution system incorporates a diffusion ring 172 in the process chamber 112. The ring 172 is located above the support surface 130 and circumscribes the region below the access port 115. The ring 182 includes an annular plenum 174 and a series of nozzles 176 extending from the plenum to open center 178 of the ring 182. The diffusion ring 172 provides for even distribution of the first gas composition about the region of maximum intensity of the magnetic field induced by the planar coil 120, as described below. Preferably, the axes of the nozzles 176 are oriented off the radius of the ring 182, as shown, in order to impart a spiral flow pattern to the injected gas.

In operation, the pressure control system maintains the interior 119 containing the first gas composition at a first setpoint pressure chosen in accordance with the requirements of the ion generation and overall etching process, the system 110 is used to best advantage when the process chamber pressure is maintained at values less than 1 mTorr, especially less than 5 milliTorr. The uniform magnetic field induced by the planar coil 120 generates a uniform flux of ions constituting the predominantly ionized element of the etching medium. The ions circulate in the process chamber 112 within a generally planar region parallel to the dielectric shield 117 and the substrate support 130.

The pressure control system maintains the interior 205 containing the second gas composition at a second setpoint pressure chosen in accordance with the requirements of the radical generation. The system 110 is used to best advantage when the auxiliary chamber pressure is maintained at values higher than the process chamber pressure; auxiliary chamber pressures greater than approximately 50 mTorr or 100 milliTorr may be used, although those skilled in the art may choose other auxiliary chamber pressures to optimize radical generation. The mass distribution system admits radicals from the auxiliary chamber 114, through valve 210, and into the process chamber 112 at a rate chosen to optimize the properties of the etching medium created by the blending of the ionized and neutral radical species. These constituents of the etching medium remove material from the substrate S by interacting with the substrate material so as to produce volatile species that are eliminated from the process chamber 112 by normal operation of the pressure control system 126.

Figure 5:
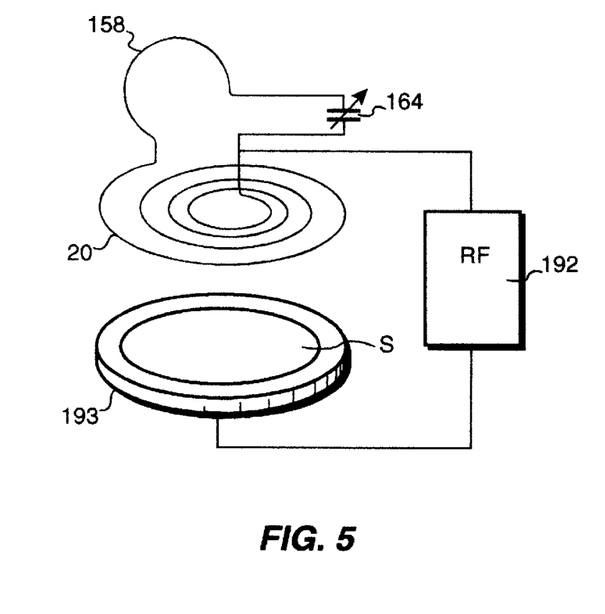
FIG. 5 is a schematic view of circuitry for imposing an rf bias on the substrate support.

With reference to FIG. 5, the electromagnetic excitation apparatus may optionally incorporate a third rf generator 192 coupling the planar coil 120 and an electrically conductive substrate support 193 to provide a controlled ion velocity component normal to the surface of the substrate S. The rf generator 192 can operate at low frequency (below about 550 kHz) or high frequency (13.56 MHz or above) and usually operates at frequency other than the frequency at which the first generator 150 operates.

In another embodiment, with reference again to FIG. 1, none of the excited constituents is generated in the chamber 12 where the processing medium is applied to the substrate. Rather, each constituent is generated in an auxiliary chamber 14 or made available to the gas distribution system 22 and then admitted to the process chamber 12 for blending with the other constituents and for treatment of the substrate. Such an approach is desirable, for example, when the most desirable reaction conditions do not provide an effective environment for generation of any of the constituents of the processing medium. One or more constituents are generated under different conditions in respective separate chambers and then admitted to the process chamber 12 to form the processing medium. One example of this embodiment is a CVD system in which the entire excited portion of the medium is generated in the auxiliary chamber 14, and then admitted to the process chamber 12. In one such process, the pressure in the auxiliary chamber 14 is higher than that in the process chamber, and greater than 50 mTorr. In general, the electromagnetic excitation system will not provide excitation to chamber 12 in such an embodiment. The excited constituent alone may function as the processing medium or may be mixed with other gaseous species admitted by the gas distribution system 22.

It will therefore be seen that the foregoing represents a highly advantageous approach to materials processing by a reactive medium, especially for enhancing reaction rates in plasma-driven processes at low temperatures. The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. An apparatus for generating a medium having a composition and including a plurality of constituents, for treating a substrate, the apparatus comprising:
   a. a first chamber;
   b. a substrate support, housed in the first chamber;
   c. at least one auxiliary chamber;
   d. a gas distribution system coupled to the first and the at least one auxiliary chamber for conveying gaseous species into the first chamber at a first gas composition and into the at least one auxiliary chamber at a respective gas composition;
   e. a source of electromagnetic excitation, coupled to each of the first and the at least one auxiliary chamber so as to impart energy to gaseous species contained therein and thereby effect generation of a first constituent, having a composition, in the first chamber at a first pressure and a first temperature and generation of a respective constituent, having a composition, in the at least one auxiliary chamber at a respective pressure and temperature;
   f. a mass transfer system for conveying the respective constituent generated in the at least one auxiliary chamber into the first chamber for blending with the first constituent so as to produce the medium; and
   g. means for monitoring the composition of at least one of
      (i.) the medium and
      (ii.) at least one of the constituents.

2. The apparatus of claim 1 wherein at least one of the first and respective gas compositions is different from another of the first and respective gas compositions.

3. The apparatus of claim 1 wherein at least one of the first and respective constituents comprises an ion.

4. The apparatus of claim 1 wherein at least one of the first and respective constituents comprises a radical.

5. The apparatus of claim 1 wherein the source of electromagnetic excitation is configured and coupled to each of the first and at least one auxiliary chambers to impart energy to gaseous species in the first chamber at a first power level, to impart energy to gaseous species in the at least one auxiliary chamber at a respective power level and to adjust at least one of the first and respective power levels independently of another of the first and respective power levels, the means for monitoring the composition being coupled to the source of electromagnetic excitation so as to allow adjustment of at least one of the first and respective power levels based on the monitored composition.

6. The apparatus of claim 1 wherein the mass transfer system conveys the respective constituent generated in the at least one auxiliary chamber into the first chamber at a respective mass transfer rate, the means for monitoring the composition being coupled to the mass transfer system so as to allow adjustment of at least one of said at least one respective mass transfer rate based on the monitored composition.

7. The apparatus of claim 1 wherein the medium etches the substrate.

8. The apparatus of claim 1 wherein the medium deposits material onto the substrate.

9. The apparatus of claim 1 further comprising a pressure control system configured to control at least one of the first and respective pressures independently of another of the first and respective pressures, the means for monitoring the composition being coupled to the pressure control system so as to allow adjustment of at least one of the first and respective pressures based on the monitored composition.

10. The apparatus of claim 1 further comprising a temperature control system configured to control at least one of the first and respective temperatures independently of another of the first and respective temperatures, the means for monitoring the composition being coupled to the temperature control system so as to allow adjustment of at least one of the first and respective temperatures based on the monitored composition.

11. The apparatus of claim 6 wherein the at least one auxiliary chamber comprises a plurality of auxiliary chambers, the mass transfer system being configured to regulate at least one of the plurality of respective mass transfer rates independently of another of the plurality of respective mass transfer rates.

12. The apparatus of claim 1 wherein the gas distribution system is coupled to the first and auxiliary chambers so as to control at least one of the first and respective gas compositions independently of another of the first and respective gas compositions, the means for monitoring the composition being coupled to the gas distribution system so as to allow adjustment of at least one of the first and respective gas compositions based on the monitored composition.

13. An apparatus for generating a partially ionized gas for etching a substrate, the partially ionized gas, having a composition and including a first constituent, having a composition, comprising an ion and a second constituent, having a composition, comprising a neutral species, the apparatus comprising:
   a. a first chamber;
   b. a substrate support, disposed in the first chamber;
   c. a second chamber;
   d. a gas distribution system coupled to the first chamber for conveying gaseous species at a first gas composition into the first chamber and coupled to the second chamber for conveying gaseous species at a second gas composition into the second chamber;
   e. a source of electromagnetic excitation, coupled to the first and second chambers so as to impart energy to gaseous species contained therein and thereby effect generation of the first constituent in the first chamber at a first pressure and a first temperature and generation of the second constituent in the second chamber at a second pressure and a second temperature; and f. a mass transfer system for conveying the second constituent from the second chamber into the first chamber for blending with the first constituent so as to produce the medium.

14. The apparatus of claim 13 further comprising means for monitoring the composition of at least one of the partially ionized gas and the constituents.

15. The apparatus of claim 14 wherein the second pressure is greater than the first pressure.

16. The apparatus of claim 14 wherein the first pressure is less than 10 milliTorr.

17. The apparatus of claim 14 wherein the second pressure is greater than 50 milliTorr.

18. The apparatus of claim 14 wherein the second pressure is greater than 100 milliTorr.

19. The apparatus of claim 16 wherein the second pressure is greater than 50 milliTorr.

20. The apparatus of claim 14 further comprising a. a third chamber, the gas distribution system being coupled to the third chamber for conveying gaseous species into the third chamber, the source of electromagnetic excitation being coupled to the third chamber so as to impart energy to gaseous species contained therein and thereby effect generation of a third constituent of the medium, the mass transfer system conveying the third constituent from the third chamber into the first chamber for blending with the first and second constituents.

21. The apparatus of claim 14 wherein the mass transfer system conveys the second constituent at a mass transfer rate, the mass transfer system comprising means for regulating the mass transfer rate, the means for monitoring the composition being configured to monitor the composition of the partially ionized medium and coupled to the mass transfer system so as to allow adjustment of the mass transfer rate based on the composition of the partially ionized medium.

22. The apparatus of claim 14 further comprising a pressure control system, coupled to the first and second chambers so as to control each of the first and second pressures independently of one another, the means for monitoring the composition being configured to monitor the composition of the partially ionized medium and coupled to the pressure control system so as to allow adjustment of at least one of the first and second pressures based on the composition of the partially ionized medium.

23. The apparatus of claim 14 further comprising a temperature control system, coupled to the first and second chambers so as to control each of the first and second temperatures independently of one another, the means for monitoring the composition being configured to monitor the composition of the partially ionized medium and coupled to the temperature control system so as to allow adjustment of at least one of the first and second pressures based on the composition of the partially ionized medium.

24. The apparatus of claim 14 wherein the source of electromagnetic excitation is configured to impart energy to gaseous species in the first chamber at a first power level and to impart energy to gaseous species in the second chamber at a second power level and coupled to each of the first and second chambers so as to determine each of the first and second power levels independently of one another, the means for monitoring the composition being configured to monitor the composition of the partially ionized medium and coupled to the source of electromagnetic excitation so as to allow adjustment of at least one of the first and second power levels based on the composition of the partially ionized medium.

25. The apparatus of claim 14 wherein the gas distribution system is coupled to the first and second chambers so as to control each of the first and second gas compositions independently of one another, the means for monitoring the composition being configured to monitor the composition of the partially ionized medium and coupled to the gas distribution system so as to allow adjustment of at least one of the first and second gas compositions based on the composition of the partially ionized medium.

26. An apparatus for generating a reactive medium for treating a substrate, the medium having a composition and including at least a first constituent, the apparatus comprising:

a. at least one chamber;

b. a gas distribution system for conveying gaseous species into the at least one chamber at a respective gas composition;

c. a source of electromagnetic excitation, coupled to the at least one chamber so as to impart energy to gaseous species contained therein and thereby effect generation, in the at least one chamber, of a respective constituent, having a composition, at a respective pressure and a respective temperature;

d. a reaction compartment;

e. a substrate support housed in the reaction compartment;

f. a mass transfer system for conveying the at least one respective constituent into the reaction compartment to produce the reactive medium at a reaction pressure and a reaction temperature; and g. a pressure control system for controlling at least one of the reaction and respective pressures independently of another of the reaction and respective pressures.

27. The apparatus of claim 26 further comprising means for monitoring the composition of at least one of the medium and the constituents.

28. The apparatus of claim 27 wherein at least one of said at least one respective constituent comprises a radical.

29. The apparatus of claim 27 wherein at least one of said at least one respective constituent comprises an ionized species.

30. The apparatus of claim 27 wherein the reaction pressure is lower than at least one of said at least one respective pressure.

31. The apparatus of claim 26 wherein at least one of said at least one respective pressure is greater than 50 milliTorr.

32. The apparatus of claim 27 wherein the mass transfer system conveys the at least one respective constituent at a respective mass transfer rate, the mass transfer system comprising means for regulating the at least one respective mass transfer rate, the means for monitoring the composition being configured to monitor the composition of the medium and coupled to the mass transfer system so as to allow adjustment of at least one of said at least one respective mass transfer rate based on the composition of the medium.

33. The apparatus of claim 27 wherein the means for monitoring composition is coupled to the pressure control system so as to allow adjustment of at least one of the reaction and respective pressures based on the monitored composition.

34. The apparatus of claim 33 wherein the means for monitoring the composition is configured to monitor the composition of the medium, the pressure control system adjusting at least one of the reaction and respective pressures based on the composition of the medium.

35. The apparatus of claim 27 wherein the at least one chamber comprises a plurality of chambers.

36. The apparatus of claim 27 wherein the source of electromagnetic excitation is configured to impart energy to gaseous species in the at least one chamber at a respective power level, the means for monitoring the composition being configured to monitor the composition of the medium and coupled to the source of electromagnetic excitation so as to allow adjustment of at least one of the at least one respective power level based on the composition of the medium.

37. The apparatus of claim 35 wherein the source of electromagnetic excitation is configured to impart energy to gaseous species in each of the plurality of chambers at a respective power level and to adjust at least one of the respective power levels independently of another of the respective power levels, the means for monitoring the composition being configured to monitor the composition of the medium and coupled to the source of electromagnetic excitation so as to allow adjustment of at least one of the plurality of respective power levels based on the composition of the medium.

38. The apparatus of claim 35 wherein the mass transfer system is configured to convey each of the plurality of respective components at a respective mass transfer rate and regulate at least one of the plurality of respective mass transfer rates independently of another of the plurality of respective mass transfer rates, the means for monitoring the composition being configured to monitor the composition of the medium and coupled to the mass transfer system so as to allow adjustment of at least one of the plurality of respective mass transfer rates based on the composition of the medium.

39. The apparatus of claim 27 further comprising a temperature control system configured to control at least one of the reaction and respective temperatures independently of another of the reaction and respective temperatures, the means for monitoring the composition being configured to monitor the composition of the medium and coupled to the temperature control system so as to allow adjustment of at least one of the reaction and respective temperatures based on the composition of the medium.

40. The apparatus of claim 35 wherein at least one of the reaction temperature and the temperature and the one or more respective temperatures.

41. The apparatus of claim 35 wherein the gas distribution system is coupled to each of the plurality of chambers so as to control at least one of the respective gas compositions independently of another of the respective gas compositions, the means for monitoring the composition being configured to monitor the composition of the medium and coupled to the gas distribution system so as to allow adjustment of at least one of the respective gas compositions based on the composition of the medium.

42. A method of treating a substrate with a medium having a composition and comprising a plurality of constituents, the method comprising the steps of:
 a. providing, at a first power level, electromagnetic excitation to gaseous species at a first location at a first gas composition so as to generate a first constituent having a composition at a first pressure and first temperature;
 b. providing electromagnetic excitation to gaseous species at least one auxiliary location at a respective gas composition, at a respective power level so as to generate a constituent, having a composition, at the at least one auxiliary location at a respective pressure and temperature, the first and respective power levels, gas compositions pressures, and temperatures being process parameters;
 c. conveying, at a respective mass transfer rate, the constituent generated at the at least one auxiliary location to the first location for blending with the first constituent so as to create the medium;
 d. monitoring the composition of at least one of the medium and the first and respective constituents;
 e. adjusting at least one of
  (i.) at least one of the process parameters and
  (ii.) at least one of said at least one respective mass transfer rate based on the monitored composition; and
 f. exposing the substrate to the medium.

43. A method of treating a substrate with a partially ionized gas having a composition and including a first constituent, having a composition, comprising an ion and a second constituent having a composition, comprising neutral species, the method comprising:
 a. providing, at a first power level, electromagnetic excitation to gaseous species at a first location at a first gas composition so as to generate the first constituent at a first pressure and first temperature;
 b. providing, at a second power level, electromagnetic excitation to gaseous species at a second location at a second gas composition so as to generate the second constituent at a second pressure and second temperature, the first and second power levels, gas compositions, pressures, and temperatures being process parameters;
 c. conveying the second constituent from the second location to the first location at a mass transfer rate for blending with the first constituent so as to create the medium;
 d. monitoring the composition of at least one of the partially ionized gas and the first and second constituent;
 e. adjusting at least one of
  (i.) at least one of the process parameters and
  (ii.) the mass transfer rate based on the monitored composition; and
 f. exposing the substrate to the medium.

44. A method of treating a substrate with a medium having a composition and comprising at least one constituent, the method comprising the steps of:
 a. controlling a reaction pressure at a reaction site and a respective pressure at at least one auxiliary location independently of the pressure at another of the reaction site and the at least one auxiliary location;
 b. providing, at a respective power level, electromagnetic excitation to gaseous species at a respective gas composition so as to generate a constituent having a composition at the at least one auxiliary location at a respective pressure and temperature;
 c. conveying, at a respective mass transfer rate, the constituent generated at the at least one auxiliary location to the reaction site for blending with the first constituent so as to create the medium at the reaction pressure and a reaction temperature; and
 d. exposing the substrate to the medium.

45. The apparatus of claim 5 wherein the monitoring means is configured to monitor the composition of the medium, the source of electromagnetic energy adjusting at least one of the first and respective power levels based on the composition of the medium.

46. The apparatus of claim 6 wherein the monitoring means is configured to monitor the composition of the medium, the mass transfer system adjusting at least one of the at least one respective mass transfer rate based on the composition of the medium.

47. The apparatus of claim 9 wherein the monitoring means is configured to monitor the composition of the medium, the pressure control system adjusting at least one of the first and respective pressures based on the composition of the medium.

48. The apparatus of claim 10 wherein the monitoring means is configured to monitor the composition of the medium, the temperature control system adjusting at least one of the first and respective temperatures based on the composition of the medium.

49. The apparatus of claim 12 wherein the monitoring means is configured to monitor the composition of the medium, the gas distribution system adjusting at least one of the first and respective gas compositions based on the composition of the medium.

50. The method of claim 42 wherein the step of monitoring the composition of at least one of the medium and the first and respective constituents comprises monitoring the composition of the medium.

51. The method of claim 50 wherein the step of adjusting at least one of (i.) at least one of the process parameters and (ii.) the respective mass transfer rate comprises adjusting at least one of the at least one respective mass transfer rate based on the composition of the medium.

52. The method of claim 50 wherein the step of adjusting at least one of (i.) at least one of the process parameters and (ii.) the respective mass transfer rate comprises adjusting at least one of the first and respective power levels based on the composition of the medium.

53. The method of claim 50 wherein the step of adjusting at least one of (i.) at least one of the process parameters and (ii.) the respective mass transfer rate comprises adjusting at least one of the first and respective gas compositions based on the composition of the medium.

54. The method of claim 50 wherein the step of adjusting at least one of(i.) at least one of the process parameters and (ii.) the respective mass transfer rate comprises adjusting at least one of the first and respective temperatures based on the composition of the medium.

55. The method of claim 50 wherein the step of adjusting at least one of (i.) at least one of the process parameters and (ii.) the respective mass transfer rate comprises adjusting at least one of the first and respective pressures based on the composition of the medium.

56. The method of claim 43 wherein the step of monitoring the composition comprises monitoring the composition of the partially ionized gas.

57. The method of claim 56 wherein the step of adjusting at least one of (i.) at least one of the process parameters and (ii.) the mass transfer rate comprises adjusting the mass transfer rate based on the composition of the partially ionized gas.

58. The method of claim 56 wherein the step of adjusting at least one (i.) at least one of the process parameters and (ii.) the mass transfer rate comprises adjusting at least one of the first and second power levels based on the composition of the partially ionized gas.

59. The method of claim 56 wherein the step of adjusting at least one of (i.) at least one of the process parameters and (ii.) the mass transfer rate comprises adjusting at least one of the first and second gas compositions based on the composition of the partially ionized gas.

60. The method of claim 56 wherein the step of adjusting at least one of (i.) at least one of the process parameters and (ii.) the mass transfer rate comprises adjusting at least one of the first and second pressures based on the composition of the partially ionized gas.

61. The method of claim 56 wherein the step of adjusting at least one of (i.) at least one of the process parameters and (ii.) the mass transfer rate comprises adjusting at least one of the first and second temperatures based on the composition of the partially ionized gas.

62. The method of claim 43 wherein the first pressure is less than 10 milliTorr.

63. The method of claim 43 wherein the second pressure is greater than 50 milliTorr.

64. The method of claim 43 wherein the second pressure is greater than 100 milliTorr.

65. The method of claim 62 wherein the second pressure is greater than 50 milliTorr.

66. The method of claim 44 wherein the at least one respective power level, gas composition, pressure and temperature are process parameters and further comprising the steps of:
  a. monitoring the composition of at least one of the medium and said at least one constituent; and
  b. adjusting at least one of
    (i.) at least one of the process parameters and
    (ii.) at least one of said at least one respective mass transfer rate based on the monitored composition.

67. The method of claim 66 wherein the step of monitoring the composition comprises monitoring the composition of the medium, the step of adjusting at least one of (i.) at least one of the process parameters and (ii.) at least one of said at least one respective mass transfer rate being based on the composition of the medium.

68. The method of claim 67 wherein the step of adjusting at least one of (i.) at least one of the process parameters and (ii.) at least one of said at least one respective mass transfer rate comprises adjusting the at least one respective mass transfer rate.

69. The method of claim 67 wherein the step of adjusting at least one of (i.) at least one of the process parameters and (ii.) at least one of said at least one respective mass transfer rate comprises adjusting at least one of the at least one respective pressure.

70. The method of claim 67 wherein the step of adjusting at least one of (i.) at least one of the process parameters and (ii.) at least one of said at least one respective mass transfer rate comprises adjusting at least one of the at least one respective temperature.

71. The method of claim 67 wherein the step of adjusting at least one of (i.) at least one of the process parameters and (ii.) at least one of said at least one respective mass transfer rate comprises adjusting at least one of the at least one respective power level.

72. The method of claim 67 wherein the step of adjusting at least one of (i.) at least one of the process parameters and (ii.) at least one of said at least one respective mass transfer rate comprises adjusting at least one of the at least one respective gas composition.

73. The method of claim 67 wherein at least one of said at least one respective pressure is greater than 50 milliTorr.

* * * * *